United States Patent
Cho et al.

(10) Patent No.: US 10,048,418 B2
(45) Date of Patent: *Aug. 14, 2018

(54) POLARIZER, METHOD OF MANUFACTURING THE POLARIZER AND DISPLAY PANEL HAVING THE POLARIZER

(71) Applicant: Samsung Display Co., Ltd., Yongin-si (KR)

(72) Inventors: Sung-Won Cho, Hwaseong-si (KR); Jung-Ha Son, Seoul (KR); Su-Bin Bae, Gyeongsan-si (KR); Yun-Jong Yeo, Seoul (KR); Joo-Hyung Lee, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 138 days.

This patent is subject to a terminal disclaimer.

(21) Appl. No.: 14/846,471

(22) Filed: Sep. 4, 2015

(65) Prior Publication Data

US 2016/0266295 A1    Sep. 15, 2016

(30) Foreign Application Priority Data

Mar. 10, 2015 (KR) .......................... 10-2015-0032887

(51) Int. Cl.
*G02B 5/30* (2006.01)
*C09K 13/00* (2006.01)
(Continued)

(52) U.S. Cl.
CPC ............ *G02B 5/3058* (2013.01); *C09K 13/00* (2013.01); *C23F 4/00* (2013.01); *B81C 1/00388* (2013.01);
(Continued)

(58) Field of Classification Search
CPC .......... G02B 5/3058; C09K 13/00; C23F 4/00; H01L 21/31111; H01L 21/31116;
(Continued)

(56) References Cited

U.S. PATENT DOCUMENTS 8,653,211 B2    2/2014  Kang et al.
9,581,745 B2 *  2/2017  Xie ..................... G02B 5/3058
(Continued)

FOREIGN PATENT DOCUMENTS

JP      2006-049401       2/2006
KR      1020050017871 A   2/2005
(Continued)

OTHER PUBLICATIONS

P.Mansky, et al., "Controlling Polymer-Surface Interactions with Random Copolymer Brushes". Science, vol. 275, No. 5305, Mar. 7, 1997, pp. 1458-1460, (abstract only).
(Continued)

*Primary Examiner* — Anita K Alanko
(74) *Attorney, Agent, or Firm* — H.C. Park & Associates, PLC

(57) ABSTRACT

A method of manufacturing a polarizer includes forming a first layer on a base substrate, forming a first partition wall layer on the first layer, forming a second partition wall layer on the first partition wall, forming a plurality of first partition wall patterns and a plurality of second partition walls disposed on the first partition wall patterns by etching the first partition wall and the second partition wall at the same time, forming a block copolymer layer on the first layer on which the plurality of first partition wall patterns are formed, forming a plurality of fine patterns from the block copolymer layer, and patterning the first layer using the fine patterns and the second partition wall patterns as a mask.

13 Claims, 12 Drawing Sheets

(51) Int. Cl.
*C23F 4/00* (2006.01)
*H01L 21/311* (2006.01)
*H01L 21/308* (2006.01)
*H01L 21/3105* (2006.01)
*H01L 21/3065* (2006.01)
*H01L 21/306* (2006.01)
*B81C 1/00* (2006.01)
*G02F 1/1335* (2006.01)
*G03F 7/004* (2006.01)

(52) U.S. Cl.
CPC .. *B81C 1/00404* (2013.01); *B81C 2201/0149* (2013.01); *G02F 2001/133548* (2013.01); *G03F 7/0041* (2013.01); *H01L 21/3065* (2013.01); *H01L 21/3081* (2013.01); *H01L 21/3088* (2013.01); *H01L 21/30604* (2013.01); *H01L 21/31056* (2013.01); *H01L 21/31111* (2013.01); *H01L 21/31116* (2013.01)

(58) Field of Classification Search
CPC ............. H01L 21/3065; H01L 21/3081; H01L 21/30604; H01L 21/3088; H01L 21/31056; B81C 1/00388; B81C 1/00404; B81C 2201/0149; G03F 7/0041; G02F 2001/133548
See application file for complete search history.

(56) References Cited

U.S. PATENT DOCUMENTS

| | | | | |
|---|---|---|---|---|
| 2005/0112902 | A1* | 5/2005 | Han | H01L 43/12 438/736 |
| 2008/0037101 | A1* | 2/2008 | Jagannathan | G02B 5/1809 359/286 |
| 2010/0119778 | A1 | 5/2010 | Lee et al. | |
| 2015/0153649 | A1* | 6/2015 | Lee | G03F 7/40 216/47 |
| 2016/0077264 | A1* | 3/2016 | Kang | G03F 7/0002 430/321 |
| 2016/0139313 | A1 | 5/2016 | Kim et al. | |
| 2016/0154158 | A1 | 6/2016 | Xie et al. | |
| 2016/0178822 | A1 | 6/2016 | Kwak et al. | |

FOREIGN PATENT DOCUMENTS

| | | |
|---|---|---|
| KR | 10-2007-0050758 | 5/2007 |
| KR | 10-2007-0122336 | 12/2007 |
| KR | 1020090001371 A | 1/2009 |
| KR | 1020100068014 | 6/2010 |
| KR | 1020110020450 A | 3/2011 |
| KR | 1020130034778 | 4/2013 |
| KR | 10-2013-0120586 | 11/2013 |
| KR | 1020140030873 | 3/2014 |
| KR | 1020150072663 | 6/2015 |
| KR | 1020150089708 | 8/2015 |
| KR | 1020150092397 | 8/2015 |
| KR | 10-2016-0059935 | 5/2016 |
| KR | 10-2016-0065302 | 6/2016 |
| KR | 10-2016-0074764 | 6/2016 |

OTHER PUBLICATIONS

Sujin Ham, et al., "Microdomain Orientation of PS-b-PMMA by Controlled Interfacial Interactions", Macromolecules vol. 41, 6431, (2008), (abstract only).

Notice of Allowance dated Dec. 19, 2017, issued in. U.S. Appl. No. 14/628,985.

* cited by examiner

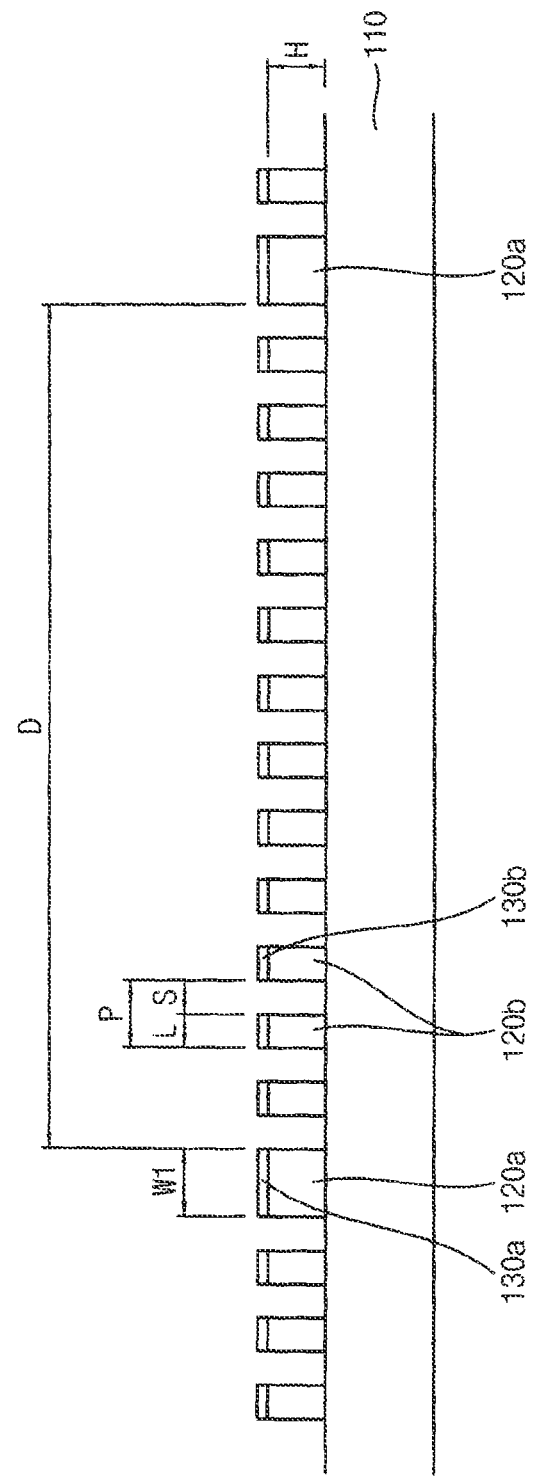

POLARIZER, METHOD OF MANUFACTURING THE POLARIZER AND DISPLAY PANEL HAVING THE POLARIZER

CROSS-REFERENCE TO RELATED APPLICATION

This application claims priority from and the benefit of Korean Patent Application No. 10-2015-0032887, filed on Mar. 10, 2015, which is hereby incorporated by reference for all purposes as if fully set forth herein.

BACKGROUND

Field

Exemplary embodiments relate to a polarizer for a display device, a method of manufacturing the polarizer, and a display panel having the polarizer.

Discussion of the Background

Recently, a display device having light weight and small size has been manufactured. A cathode ray tube (CRT) display device has been used due to a performance and a competitive price. However the CRT display device has a weakness with a size or portability. Therefore a display device such as a plasma display panel (PDP), a liquid crystal display (LCD) and an organic light emitting display (OLED) has been highly regarded due to small size, light weight and low-power-consumption.

The liquid crystal display device applies a voltage to specific molecular arrangement configured to change the molecular arrangement. The liquid crystal display device displays an image using changes of optical property (for example, birefringence, rotatory polarization, dichroism and light scattering) of a liquid crystal cell according to the changes of the molecular arrangement.

The liquid crystal display device includes a polarizer configured to control molecular arrangement of the liquid crystal. Recently, in-cell polarizer structure that the polarizer is formed inside of the display panel may be applied to the liquid crystal display device. For example, a wire grid polarizer may be used. However, there has been a problem due to uneven pattern of the wire grid polarizer, aperture ratio may be decreased.

The above information disclosed in this Background section is only for enhancement of understanding of the background of the inventive concept, and, therefore, it may contain information that does not form the prior art that is already known in this country to a person of ordinary skill in the art.

SUMMARY

One or more exemplary embodiment of the inventive concept provides a polarizer and a method of manufacturing the polarizer, and display panel having the polarizer capable of improving an aperture ratio.

Additional aspects will be set forth in the detailed description which follows, and, in part, will be apparent from the disclosure, or may be learned by practice of the inventive concept.

According to an exemplary embodiment, a polarizer includes a base substrate, a plurality of partition wall patterns disposed on the base substrate and spaced apart from each other, and a plurality of wire grid patterns disposed on the base substrate and disposed between the partition wall patterns. The wire grid patterns include a plurality of wire grids, and each of the partition wall patterns has a width larger than a width of the each of the plurality of wire grids.

In an exemplary embodiment, the plurality of partition wall patterns and the plurality of wire grid patterns may be formed at a same layer.

In an exemplary embodiment, a distance between the adjacent partition wall patterns may be about 2 um (micrometer) to 4 um.

In an exemplary embodiment, the width of the partition wall pattern may be about 1.25 um to 2.5 um, and the width of each of the plurality of the wire grids is about 45 nm to 65 nm.

According to an exemplary embodiment, a method of manufacturing a polarizer includes forming a first layer on a base substrate, forming a first partition wall layer on the first layer, forming a second partition wall layer on the first partition wall, forming a plurality of first partition wall patterns and a plurality of second partition wall patterns disposed on the first partition wall patterns by etching the first partition wall and the second partition wall at the same time, forming a block copolymer layer on the first layer on which the plurality of first partition wall patterns are formed, forming a plurality of fine patterns from the block copolymer layer, and patterning the first layer using the fine pattern as a mask.

In an exemplary embodiment, the first partition wall layer comprises a material having relatively higher etch selectivity in comparison with the second partition wall layer.

In an exemplary embodiment, the first partition wall layer may include silicon nitride, and the second partition wall layer may include silicon oxide.

In an exemplary embodiment, the block copolymer layer may include first polymer blocks and second polymer blocks which are in covalent bond with 1:1 volume ratio.

In an exemplary embodiment, the step of forming the plurality of fine patterns may further include forming the plurality of fine patterns having a plurality of first blocks and a plurality of second blocks which have monomer units. The plurality of second blocks may consist of monomer unit having components different from components of monomer unit of the plurality of first block. The plurality of first and the plurality of second blocks may be formed by rearrangement of components of the block copolymer layer through a phase separation.

In an exemplary embodiment, each of the plurality of second partition wall patterns may be more than twice wider each of the plurality of first partition wall patterns.

In an exemplary embodiment, each of the plurality of first partition wall patterns may be about 0.5 to 1 um (micrometer) wide, and each of the plurality of second partition wall patterns may be about 1.25 to 2.5 um wide.

In an exemplary embodiment, the method may further include forming a second layer on the first layer before forming the plurality of first partition wall layers.

In an exemplary embodiment, the method may further include forming a plurality of wire grid patterns corresponding to the plurality of fine patterns and a partition wall patterns corresponding to the plurality of second partition wall pattern by patterning the first layer.

In an exemplary embodiment, a width of each of the plurality of partition wall patterns may be substantially same as that of each of the plurality of second partition wall patterns.

In an exemplary embodiment, a cross-section of each of the plurality of first partition wall patterns and each of the plurality of second partition wall patterns may be trapezoid having an upper side longer than a lower side.

In an exemplary embodiment, a cross-section of each of the plurality of first partition wall patterns and the plurality of second partition wall patterns may be a shape that has upper side longer than a lower side, and has a curved side.

In an exemplary embodiment, forming the plurality of first partition wall patterns and the plurality of second partition wall patterns may further include forming a third later on the second layer, forming a fifth layer on the second layer, forming a photoresist pattern on the fifth layer, forming a fifth layer pattern by etching the fifth layer using the photoresist pattern as a mask, forming a sixth layer on the fifth layer pattern and the third layer, forming a sixth layer pattern by etching the sixth layer, removing the fifth layer pattern, forming a third layer pattern by etching the third layer using the sixth layer pattern as a mask, and forming the plurality of first partition wall patterns and the plurality of second partition wall patterns by etching the first partition wall and the second partition wall using the third layer pattern as a mask at the same time.

According to an exemplary embodiment, a display panel includes a first substrate comprising a base substrate and a polarizer disposed on the base substrate, a second substrate facing the first substrate, and a liquid crystal layer disposed between the first substrate and the second substrate. The polarizer includes a plurality of partition wall patterns disposed on the base substrate and spaced apart from each other, and a wire grid patterns disposed on the base substrate and disposed between the partition wall patterns. The wire grid patterns include a plurality of wire grids, and each of the partition wall patterns has a width larger than a width of the wire grid.

According to the present example embodiment, a polarizer may include a plurality of partition wall patterns having a first width. A wire grid pattern may be uniformly disposed between the partition all patterns.

According to the present example embodiment of a method of manufacturing polarizer, a first width of the first partition wall pattern is smaller than a second width of the second partition wall pattern, and a first height of the first partition wall pattern may be more than two times higher than height of first and second blocks of the block copolymer layer. Accordingly, where uneven pattern formed adjacent to the first partition wall pattern due to agglomeration of the first and second blocks may be covered by the second partition wall pattern, so that uniform wire grid pattern may be formed between the second partition wall patterns.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

FIG. 1 is a cross-sectional view illustrating a polarizer according to an exemplary embodiment;

DETAILED DESCRIPTION OF THE ILLUSTRATED EMBODIMENTS

Figure 2A:
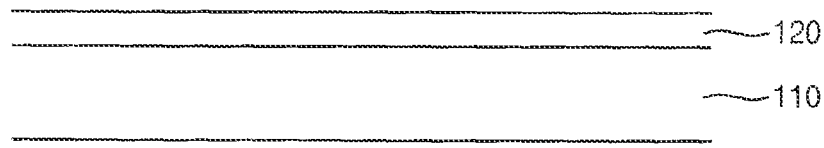
FIGS. 2A through 2O are cross-sectional views illustrating a method of manufacturing the polarizer of FIG. 1.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the"

are intended to include the plural forms as well, unless the context clearly indicates otherwise. Moreover, the terms "comprises," comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

FIG. 1 is a cross-sectional view illustrating a polarizer according to an exemplary embodiment.

Referring to FIG. 1, the polarizer may include a base substrate 110, partition wall patterns 120a, and wire grid patterns 120b.

The polarizer may further include metal patterns 130a and 130b which is disposed on the partition wall patterns 120a and the wire grid patterns 120b.

The base substrate 110 may comprise a material which has relatively high transmittance, thermal resistance, and chemical resistance. For example the base substrate 110 may comprise any one selected from the group consisting of glass, polyethylenenaphthalate, Polyethylene terephthalate, polyacryl and a mixture thereof.

The partition wall patterns 120a may be disposed on the base substrate 110. A plurality of the partition wall patterns 120a may be disposed spaced apart each other by a predetermined distance on a cross-section of the polarizer. The partition wall patterns 120a may have a height H and a first width W1. The partition wall patterns 120a may extend in a direction which is substantially same as an extending direction of the wire grids of the wire grid patterns 120b.

For example, the height H of the partition wall pattern 120a may be abort 80 nm (nanometer) to about 200 nm. The first width W1 of the partition ail pattern 120a may be about 1.25 um (micrometer) to about 2.5 um.

The partition wall pattern 120a may comprise any one selected from the group consisting of aluminum (Al), gold (Au), silver (Ag), copper (Cu), chrome (Cr), iron (Fe), nickel Ni), molybdenum (Mo) and tungsten (W).

For example, two partition wall patterns 120a which are disposed adjacent each other may be spaced apart from each other by about 2 um to about 4 um. Thus, a distance D between the two partition wall patterns 120a may be about 2 urn to about 4 um.

The metal patterns 130a may be disposed on the partition wall patterns 120a. The metal patterns 130a may comprise molybdenum (Mo) or titanium (Ti). Thickness of the metal pattern 130a may be about 10 nm to about 20 nm.

The wire grid patterns 120b may be disposed on the base substrate 110 and between the partition wall patterns 120a. The wire grid patterns 120b forms a plurality of wire grids which extends in a direction. The each wire grid has a height H and a width L. The wire grids adjacent each other are spaced apart from each other by a space S. Thus, the ire grid patterns 120b may form the wire grids having the height H, the width L and a pitch P which is sum of the width L and the space S.

The wire grid patterns 120b may comprise any one selected from the group consisting of aluminum (Al), gold (Au), silver (Ag), copper (Cu), chrome (Cr), iron (Fe), nickel (NO, molybdenum (Mo) and tungsten (W).

The pitch P is defined as sum of the width L and the space S. The height H, the width L and the space S of the wire grid may have an optimal range according to material of the wire grid pattern 120b. For example, the width L may be about 45 nm to about 65 nm the space S may be about 45 nm to about 65 nm, and the height H may be about 80 nm to about 200 nm.

The metal patterns 130b may be disposed on the wire grid pattern 120b. The metal pattern 130b may comprise molybdenum (Mo) or titanium (Ti). Thickness of the metal pattern 130b may be about 10 nm to about 20 nm.

Figure 2B:
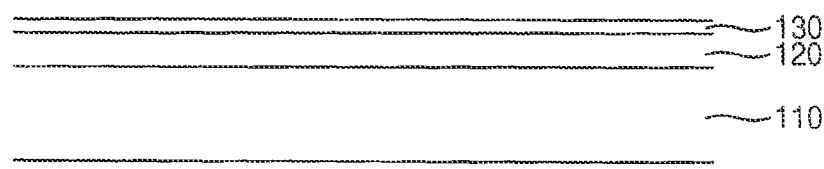
Figure 2C:
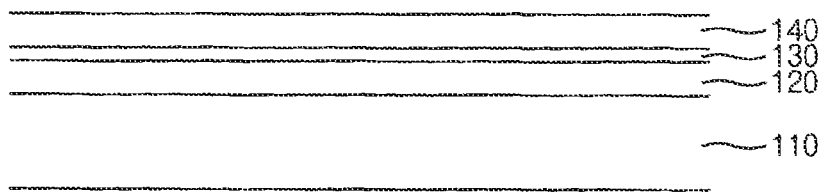
Figure 2D:
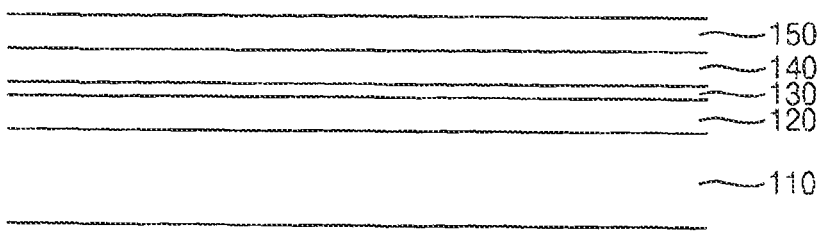
Figure 2E:
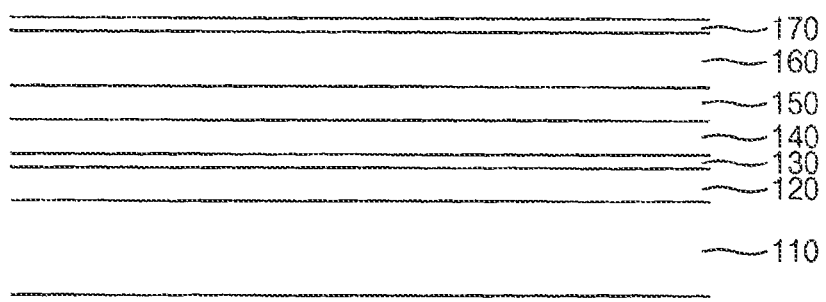
Figure 2F:
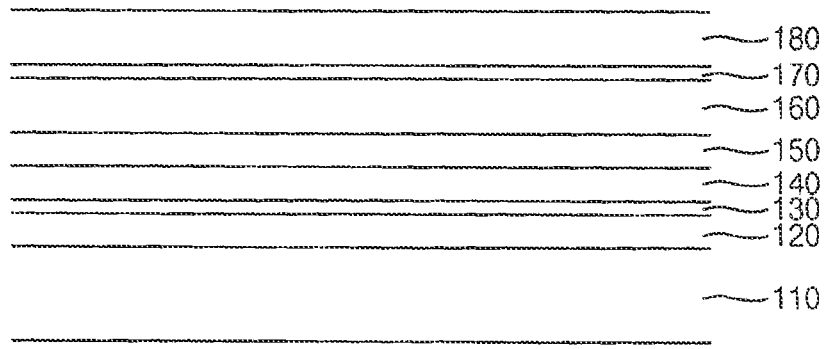
Figure 2G:
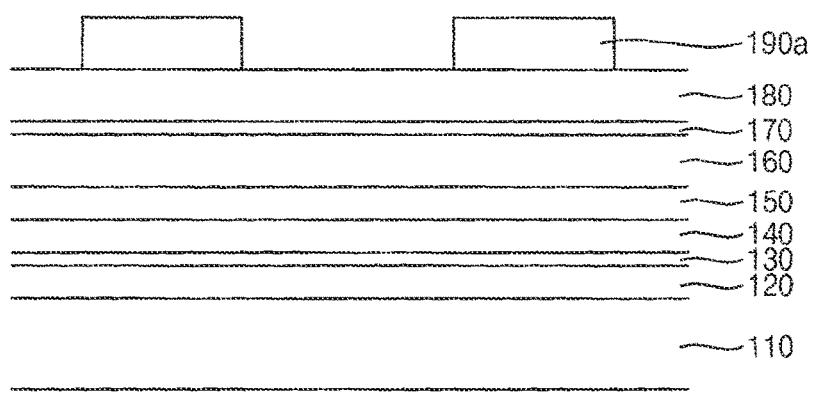
Figure 2H:
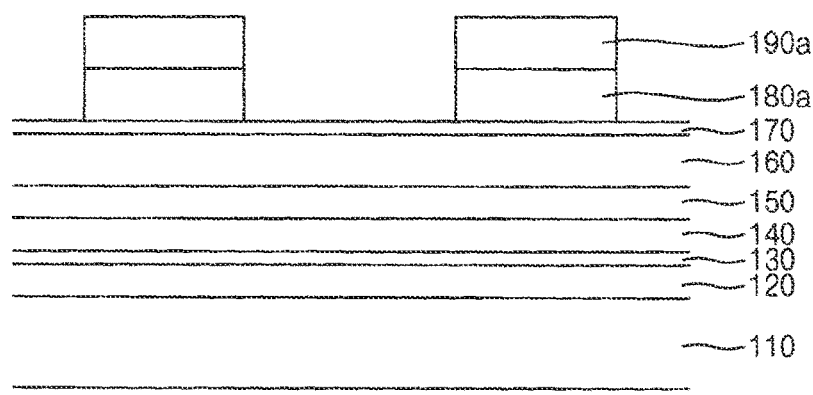
Figure 2I:
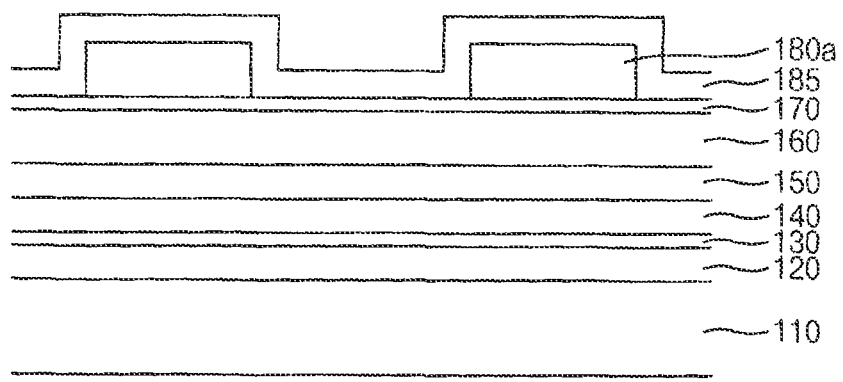
Figure 2J:
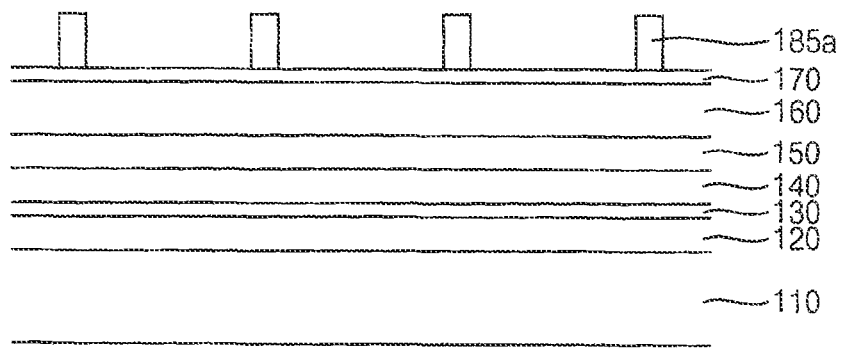
Figure 2K:
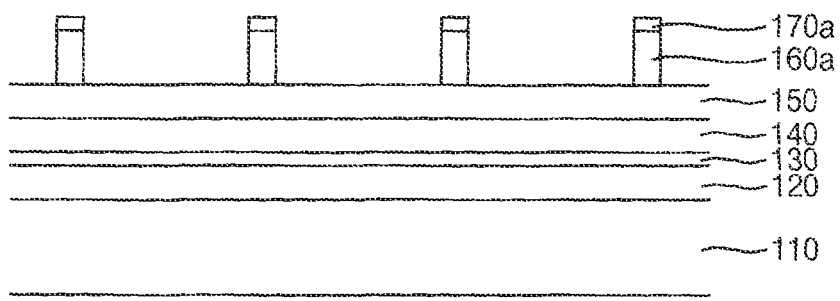
Figure 2L:
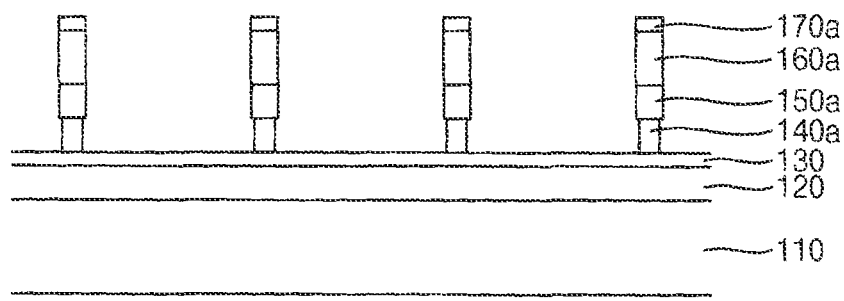
Figure 2M:
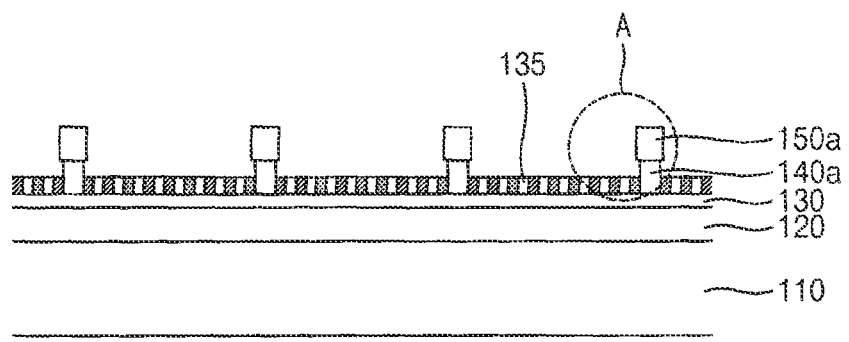
Figure 3:
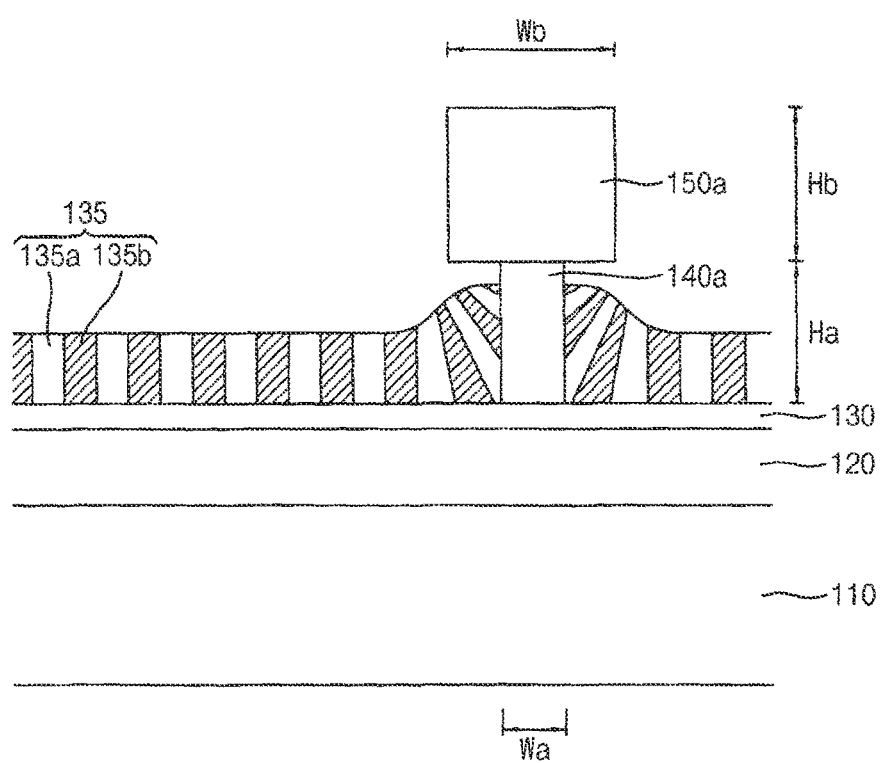
FIG. 3 is a partial enlarged view illustrating A of FIG. 2M.

FIGS. 2A through 2O are cross-sectional views illustrating a method of manufacturing the polarizer of FIG. 1, and FIG. 3 is a partial enlarged view illustrating A of FIG. 2M.

The thickness of the components (such as a first layer, a second layer, a first partition wall layer, a second partition wall layer, etc.) provided in the manufacturing process are exaggerated in FIGS. 2A through 2O.

Referring to FIG. 2A, a first may be formed on a base substrate 110. The base substrate 110 may comprise a material which has relatively high transmittance, thermal resistance, and chemical resistance. For example the base substrate 110 may include any one selected from the group consisting of glass, polyethylenenaphthalate, Polyethylene terephthalate, polyacryl and a mixture thereof.

The first layer 120 may be formed on the base substrate 110 via a deposition process. For example, the first layer 120 may be formed on the base substrate 110 by a sputtering process, a chemical vapor deposition process and the like. The first layer 120 may comprise copper (Cu), silver (Ag), chrome (Cr), molybdenum (Mo), aluminum (Al), titanium (Ti), manganese (Mn), etc. The first layer 120 may have a single layer structure or a multi layer structure, which may comprise alloy thereof or a plurality of metal layers including different materials. For example, the first layer 120 may comprise aluminum.

The first layer 120 may have a thickness of about 80 nm (nanometer) to about 200 nm.

Referring to FIG. 2B, a second layer 130 may be formed on the first layer 120. The second layer 130 may be formed on the first layer 120 via a deposition process. Thickness of the second layer 130 may be about 10 nm to about 20 nm. For example, the second layer 130 may be formed on the first layer 120 by a printing process, a sputtering process, a CVD process, a pulsed laser deposition (PLD) process, a vacuum evaporation process, an atomic layer deposition (ALD) process, etc. The second layer 130 may comprise molybdenum (Mo) or titanium (Ti). For example, the second layer 130 may comprise titanium.

Referring to FIG. 2C, a first partition wall layer 140 may be formed on the second layer 130. The first partition wall layer 140 may have thickness of about 0.5 um (micrometer) to about. The first partition wall layer 140 may be formed by a spin coating process, a CVD process, a PECVD process, an HDP-CVD process, etc.

Referring to FIG. 2D, a second partition wall layer 150 may be formed on the first partition wall layer 140. The second partition wall layer 150 may have thickness of about 0.5 um to about 1 um. The second partition wall layer 150 may be formed by a spin coating process, a CVD process, a PECVD process, an HDP-CVD process, etc.

The first partition wall layer 140 may comprise a material having relatively high etch selectivity in comparison with the second partition wall layer 150. For example, the first partition wall layer 140 may have a dry etch selectivity higher than that of the second partition wall layer 150. For example, the first partition wall layer 140 may comprise silicon nitride (SiNx), and the second partition wall layer 150 may comprise silicon oxide (SiOx).

Referring to FIG. 2E, a third layer 160 may be formed on the second partition wall layer 150. The third layer 160 may be formed on the second partition wall layer 150 via a deposition process. For example, the third layer 160 may be formed on the second partition wall layer 150 by a printing process, a sputtering process, a CVD process, a pulsed laser deposition (PLD) process, a vacuum evaporation process, an atomic layer deposition (ALD) process, etc. The third layer 160 may comprise copper (Cu), silver (Ag), chrome (Cr), molybdenum (Mo), aluminum (Al), titanium (Ti), manganese (Mn), etc. The third layer 60 may have a single layer structure or a multi layer structure, which may comprise alloy thereof or a plurality of metal layers including different materials. For example, the third layer 160 may comprise aluminum.

A fourth layer 170 may be formed on the third layer 160. The fourth layer 170 may be formed on the third layer 160 via a deposition process. For example, the fourth layer 170 may be formed on the third layer 160 by a printing process, a sputtering process, a CVD process, a pulsed laser deposition (PLD) process, a vacuum evaporation process, an atomic layer deposition (ALD) process, etc. The fourth layer 170 may comprise molybdenum (Mo) or titanium (Ti). For example, the fourth layer 170 may include titanium.

Referring to FIGS. 2F and 2G, a fifth layer 180 may be formed on the fourth layer 170. For example, the fifth layer 180 may be formed by a spin coating process, a CVD process, a PECVD process, an HDP-CVD process, etc.

The fifth layer 180 may comprise a material different from that of a sixth layer 185 which will be mentioned layer. For example, the fifth layer 180 may comprise silicon nitride (SiNx), and the sixth layer 185 may comprise silicon oxide (SiOx).

Referring to FIG. 2G, a photoresist pattern 190a may be formed on the fifth layer 180. A photoresist layer (not shown) may be formed on the fifth layer 180, and then the photoresist pattern 190a may be formed by pattern in the photoresist layer. For example, the photoresist pattern 190a may be formed by a photolithography process, a soft lithography process, a nano imprint process, a scanning probe-lithography process, etc Referring to FIG. 2H, a fifth layer pattern 180a may be formed by pattering the fifth layer 180 using the photoresist pattern 190a as a mask. The fifth layer pattern 180a may have a pattern shape substantially same as the photoresist pattern 190a. And then, the photoresist 2o pattern 190a may be removed.

Referring to FIG. 2I, a sixth layer 185 may be formed on the fifth layer pattern 180a and the fourth layer 170. The sixth layer 185 may cover upper and side surfaces of the fifth layer pattern 180a, and an upper surface of the fourth layer 170 which is not covered by the fifth layer pattern 180a.

The sixth layer 185 may include a material different from that of the fifth layer pattern 180a. For example, the fifth layer pattern 180a may comprise silicon nitride SiNx, and the sixth layer 185 may comprise silicon oxide SiOx.

Referring to FIG. 2J, a sixth layer pattern 185a may be formed by etching the sixth layer 185. The sixth layer 185 may remain as a partition wall extending in a vertical direction in a cross-sectional view after the etching process, so that the sixth layer pattern 185a may be formed. Thus, the sixth layer pattern 185a may form the partition wall. And it may look like the fifth layer pattern 180a is filled in a space between the partition walls.

And then, the fifth layer pattern 180a may be removed. The fifth layer pattern 180a may be removed via a stripping process.

Here, the sixth layer pattern 185a may be a plurality of partition walls spaced apart each other by a uniform distance. The partition walls of the sixth layer pattern 185a may be spaced apart from each other by about 2 um (micrometer) to about 4 um. The partition wall of the sixth layer pattern 185a may have a width about 1.25 um (micrometer) to about 2.5 um.

The distance between the partition walls of the sixth layer pattern 185a may be substantially same as a distance between second partition wall patterns 150a which will be mentioned later. In addition, the width of the partition wall of the sixth layer pattern 185a may be substantially same as that of the second partition wall pattern 150a.

Referring to FIG. 2K, a fourth layer pattern 170a and a third layer pattern 160a may be formed by patterning the fourth layer 170 and the third layer 160 using the sixth layer pattern 185a as a mask. For example, the fourth layer pattern 170a and the third layer pattern 160a may be formed by dry etching the fourth layer 170 and the third layer 160 using the sixth layer pattern 185a as a mask.

And then, the sixth layer pattern 185a may be removed.

Referring to FIG. 2L, a second partition wall pattern 150a and a first partition wall pattern 140a by patterning the second partition wall layer 150 and the first partition wall layer 140 using the fourth layer pattern 170a and the third layer pattern 160a as a mask.

The first partition wall pattern 140a may include a material having relatively high etch selectivity in comparison with a second partition wall pattern 150a, so that width of the first partition wall pattern 140a is smaller than width of the second partition wall pattern 150a. Thus, a cross-section of the first and second partition wall patterns 140a and 150a may have a T shape.

For example, the first partition wall patterns 140a may include a material having relatively high dry etch selectivity in comparison with the second partition wall pattern 150a, and the first and second partition walls 140 and 150 may be dry etched using fluoride gas.

Figure 2N:
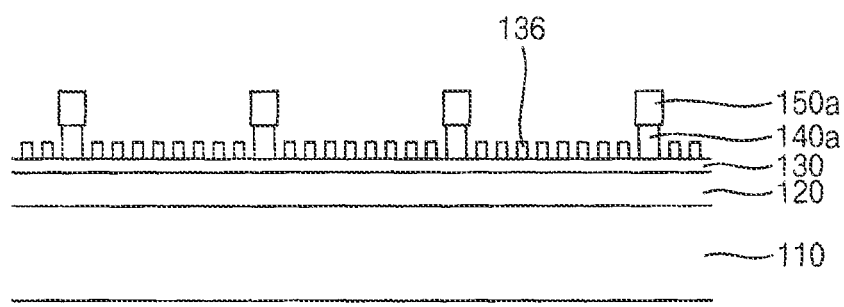
Figure 20:
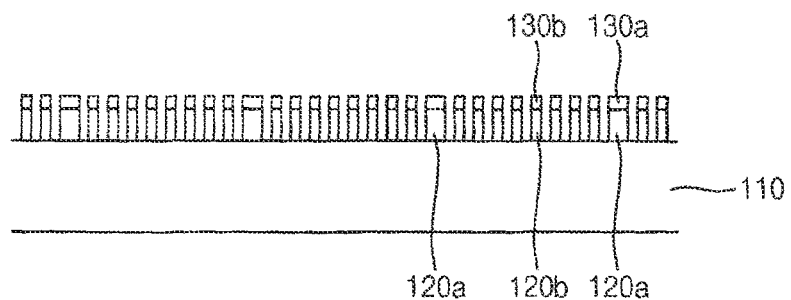

Although not shown in the figure, a neutral layer may be formed on the second layer 130 and between the first and second partition wall patterns 140a and 150a, before a block copolymer layer 135, which will be mentioned later in FIG. 2N, is formed.

The neutral layer is neither hydrophobic nor hydrophilic. The neutral layer may include a self-assembled monolayer (SAM), a polymer brush, a cross-linked random copolymer mat, or an organic monolayer including a cross-linked random copolymer mat.

Materials that may be used for the self-assembled monolayer include phenethyltrichlorosilane (PETCS), phenyltrichlorosilane (PTCS), benzyltrichlorosilane (BZTCS), tolyltrichlorosilane (TTCS), 2-[(trimethoxysilyl)ethl]-2-pyridine (PYRTMS), 4-biphenylyltrimethowysilane (BPTMS), octadecyltrichlorosilane (OTS), 1-naphthyltrimehtoxysilane (NAPTMS), 1-[(trimethoxysilyl)methyl] naphthalene (MNATMS), (9-methylanthracenyl)trimethoxysilane (MANTMS), or other similar materials.

Materials that may be used for the polymer brush include polystyrene-random-poly (methylmethacrylate) (PS-random-PMMA) or other similar materials.

Materials that may be used for the cross-linked random copolymer mat include benzocyclobutene-functionalized polystyrene-r-poly (methacrylate) copolymer P(s-r-BCB-r-MMA) or other similar materials.

In some preferred embodiments, the neutral layer may include PS-random-PMMA.

The surface of the second layer 130 may be pre-treated using an acid solution before forming the neutral layer on the surface of the second layer 130. The acid pre-treatment increases the affinity between the second layer 130 and the neutral layer, which improves the bonding of the neutral layer to the second layer 130. The acid solution may include, for example, hydrofluoric acid.

Referring to FIGS. 2M and 3, a block copolymer layer 135 may be formed on the second layer 130 between the first and second partition wall patterns 140a and 150a.

The block copolymer layer 135 may include a block copolymer obtained by using at least two polymer blocks. Particularly, the block copolymer in the material layer 110 may be a block copolymer obtained through a covalent bonding of a first polymer block and a second polymer block in a volume fraction of about 1:1. The block copolymer may be a two-component or di-block copolymer (AB) including two kinds of block copolymers (A and B), a three-component or tri-block copolymer (ABA) including two kinds of block copolymers (A and B), a three-component copolymer (ABC) including three kinds of block copolymers (A, B and C) or a multi-component block copolymer. The block copolymer may include a linear or a branch type polymer having a molecular weight of about 3,000 to about 2,000,000 g/mol The block copolymer may include polystyrene-block-polymethylmethacrylate, polybutadiene-block-polybutylmethacrylate, polybutadiene-block-polydimethylsiloxane, polybutadiene-block-polymethylmethacrylate, polybutadiene-block-polyvinylpyridine, polybutylacrylate-block-polymethylmethacrylate, polybutylacrylate-block-polyvinylpyridine, polyisoprene-block-polyvinylpyridine, polyisoprene-block-polymethylmethacrylate, polyhexylacrylate-block-polyvinylpyridine, polyisobutylene-block-polybutylmethacrylate, polyisobutylene-block-polymethylmethacrylate, polyisobutylene-block-polybutylmethacrylate, polyisobtylene-block-polydimethylsiloxane, polybutylmethacrylate-block-polybutylacrylate, polyethylethylene-block-polymethylmethacrylate, polystyrene-block-polybutylmethacrylate, polystyrene-block-polybutadiene, polystyrene-block-polyisoprene, polystyrene-block-polydimethylsiloxane, polystyrene-block-polyvinylpyridine, polyethylethylene-block-polyvinylpyridine, polyethylene-block-polyvinylpyridine, polyvinylpyridine-block-polymethylmethacrylate, polyethyleneoxide-block-polyisoprene, polyethyleneoxide-block-polybutadiene, polyethyleneoxide-block-polystyrene, polyethyleneoxide-block-polymethylmethacrylate, polyethyleneoxide-block-polydimethylsiloxane, polystyrene-block-polyethyleneoxide, polystyrene-block-polymethylmethacrylate-block-polystyrene, polybutadiene-block-polybutylmethacrylate-block-polybutadiene, polybutadiene-block-polydimethylsiloxane-block-polybutadiene, polybutadiene-block-polymethylmethacrylate-block-polybutadiene, polybutadiene-block-polyvinylpyridine-block-polybutadiene, polybutylacrylate-block-polymethylmethacrylate-block-polybutylacrylate, polybutylacrylate-block-polyvinylpyridine-block-polybutylacrylate, polyisoprene-block-polyvinylpyridine-block-polyisoprene, polyisoprene-block-polymethylmethacrylate-block-polyisoprene, polyhexylacrylate-block-polyvinylpyridine-block-polyhexylacrylate, polyisobutylene-block-polybutylmethacrylate-block-polyisobutylene, polyisobutylene-block-polymethylmethacrylate-block-polyisobutylene, polyisobutylene-block-polybutylmethacrylate-block-polyisobutylene, polyisobutylene-block-polydimethylsiloxane-block-polyisobutylene, polybutylmethacrylate-block-polybutylacrylate-block-polybutylmethacrylate, polyethylethylene-block-polymethylmethacrylate-block-polyethylethylene, polystyrene-block-polybutylmethacrylate-block-polystyrene, polystyrene-block-polybutadiene-block-polystyrene, polystyrene-block-polyisoprene-block-polystyrene, polystyrene-block-polydimethylsiloxane-block-polystyrene, polystyrene-block-polyvinylpyridine-block-polystyrene, polyethylethylene-block-polyvinylpyridine-block-polyethylethylene, polyethylene-block-polyvinylpyridine-block-polyethylene, polyvinylpyridine-block-polymethylmethacrylate-block-polyvinylpyridine, polyethyleneoxide-block-polyisoprene-block-polyethyleneoxide, polyethyleneoxide-block-polybutadiene-block-polyethyleneoxide, polyethyleneoxide-block-polystyrene-block-polyethyleneoxide, polyethyleneoxide-block-polymethylmethacrylate-block-polyethyleneoxide, polyethyleneoxide-block-polydimethylsiloxane-block-polyethyleneoxide, polystyrene-block-polyethyleneoxide-block-polystyrene, etc.

In addition, the block copolymer layer 135 may include a block copolymer obtained by a covalent bond of a first polymer block and a second polymer block in a volume fraction of about 1:1, a first homopolymer having the same repeating unit as the first polymer block and a second homopolymer having the same repeating unit as the second polymer block. For example, when the block copolymer in the block copolymer layer 135 is polystyrene (PS)-polymethylmethacrylate (PMMA) copolymer, the block copolymer layer 135 may further include PS as the first homopolymer and PMMA as the second homopolymer, respectively. The amount added of the first homopolymer and the second homopolymer in the block copolymer layer 135 may be the same. The amount of the first homopolymer and the second homopolymer may be, respectively, about 0 to about 60% by weight based on the amount of the block copolymer.

Referring to FIG. 3, components in the block copolymer layer 135 may be rearranged through a phase separation of the block copolymer layer 135 to form a minute pattern layer including a plurality of first blocks 135a and a plurality of second blocks 135b, which include monomer units having components different from each other. The plurality of the first blocks 135a and the plurality of the second blocks 135b may have different polarities according to the repeating unit of the polymers constituting the first and second blocks 135a and 135b.

Each of the polymer blocks of the block copolymer phase separated from the block copolymer layer 135 may have different polarities depending on hydrophilic groups included in the polymer blocks. The first block 135a and the second block 135b may be alternately and repeatedly arranged in that sequence on the second layer 130. In order to rearrange the components in the block copolymer layer 135 through the phase separation of the block copolymer layer 135, the block copolymer layer 135 may be annealed at a temperature higher than a second glass transition temperature of the block copolymer (Tg_BC) in the block copolymer layer 135. Particularly, in order to perform the phase separation of the block copolymer layer 135, the block copolymer layer 135 may be annealed at a temperature in a range of about 100° C. to about 190° C. for a period of time in a range of about 1 to about 24 hours. In this case, annealing of the block copolymer layer 135 may be performed at a temperature lower than the first glass transition temperature of the block copolymer (Tg_PR). For example, although PS-b-PMMA can self-assemble at a temperature of about 100° C., the PS-b-PMMA may require a long time to self-assemble at that temperature. However, if the PS-b-PMMA undergoes heat treatment at a temperature of about 250° C. in a high vacuum atmosphere, the molecules in the PS-b-PMMA will flow more quickly and smoothly compared to the flow at about 100° C. Accordingly, the self-assembly of the PS-b-PMMA can be completed within a relatively shorter time at the higher temperature (of about 250° C.), with the self-assembled PS-b-PMMA having a more uniform lamella structure.

Prior to the heat treatment, the first block and the second block are distributed in a disorderly manner. During the heat treatment, the molecules in the block copolymer move around to form a specific pattern. For example, the first blocks form a first specific pattern, and the second blocks form a second specific pattern. The first and second specific patterns (of the blocks of the block copolymer) constitute the lamella structure.

Width and height of each of the first block and the second block may be determined as required. For example, width of each of the first blocks and each of second blocks may be about 45 nm to about 65 nm, and height of them may be about 80 nm to about 200 nm.

Referring again to FIG. 3, the width and height of the first partition wall pattern 140a may be determined as required. For example, a first width Wa of the first partition wall pattern 140a may be about 0.5 um to about 1 um.

The height Ha of the first partition wall pattern 140a may be more than two times larger than height of each of the first block and the second block. For example, the first height Ha of the first partition wall pattern 140a may be about 0.5 um to about 1 um.

Width and height of the second partition wall pattern 150a may be determined as required. A second width Wb of the second partition wall pattern 150a may be about 2.5 times of the first width Wa of the first partition wall pattern 140a, and a second height Hb of the second partition wall pattern 150a may be substantially same as the first height Ha of the first partition wall pattern 140a. For example, second width Wb of the second partition wall pattern 150a may be about 1.25 um to about 2.5 um. The second height Hb of the second partition wall pattern 150a may be about 0.5 to 1 um.

Referring to FIG. 2N, a fine pattern 136 may be formed from the block copolymer layer 135 in FIG. 3 on the second layer 130. The fine pattern 136 may be formed by removing the first blocks 135a or the second blocks 135b as illustrated in FIG. 3. For example, the second blocks 135b may be removed to form the fine pattern 136. However, the present invention may not be limited thereto. For example, the first blocks 135a may be removed to form the fine pattern mask.

One of the first blocks 135a or the second blocks 135b may be removed by dry or wet etching process. When the block copolymer is PS-b-PMMA, the wet etching process may be performed using acetic acid solution after UV-ozone Treatment (UVO), or PMMA block may be selectively removed by dry etching such as an oxygen plasma etching.

Referring to FIG. 2O, a partition wall pattern 120a, a wire grid pattern 120b and a metal pattern 130a and a 130b may be formed by patterning the first layer 120 and the second layer 130 using the fine pattern 136 and the second partition wall pattern 150a as a mask. For example, the partition wall pattern 120a and the metal pattern 130a may be formed by dry etching the first layer 120 and the second layer 130 using the second partition wall pattern 150a as a mask and the wire grid pattern 120b and the metal pattern 130b may be formed by dry etching the first layer 120 and the second layer 130 using the fine pattern 136 as a mask. Accordingly, a polarizer may be formed.

Referring to FIG. 3, the first width Wa of the first partition wall pattern 140a may be smaller than the second width Wb of the second partition wall pattern 150a, and the first height Ha of the first partition wall pattern 140a may be more than two times higher than height of the first and second blocks of the block copolymer layer 135. Accordingly, where uneven pattern formed adjacent to the first partition wall pattern 140a due to agglomeration of the first and second blocks may be covered by the second partition wall pattern 150a, so that uniform wire grid pattern may be formed between the second partition wall patterns 150a. Thus, the partition wall pattern 120a and the metal pattern 130a may be formed by dry etching the first layer 120 and the second layer 130 using the second partition wall pattern 150a as a mask.

In addition, when the second partition wall layer 150 and the first partition wall layer 140 are patterned, the first partition wall layer 140 may include material having relatively high dry etch selectivity in comparison with the second partition wall layer 150, so that width of the second partition wall pattern 150a may be smaller than that of the first partition wall pattern 140a.

Referring to FIGS. 2O and 1, the polarizer may include the base substrate 110, the partition wall pattern 120a, the wire grid pattern 120b and the metal pattern 130a and 130b.

The partition wall pattern 120a may be disposed on the base substrate 110. A plurality of the partition wall patterns 120a may be disposed spaced apart each other by a predetermined distance on a cross-section of the polarizer. The partition wall pattern 120a may have a height H and a first width W1. The partition wall pattern 120a may extend in a direction which is substantially same as an extending direction of the wire grids of the wire grid pattern 120b which will be mentioned later.

For example, the height H of the partition wall patterns 120a may be about 80 nm (nanometer) to about 200 nm. The first width W1 of the partition wall patterns 120a may be about 1.25 um (micrometer) to about 2.5 um.

For example, two partition wall patterns 120a which are disposed adjacent each other may be spaced apart from each other by about 2 um to about 4 um. Thus, a distance D between the two partition wall patterns 120a may be about 2 um to about 4 um.

The wire grid pattern 120b may be disposed on the base substrate 110 and between the partition wall patterns 120a. The wire grid pattern 120b forms a plurality of wire grids which extends in a direction. The wire grid has a height H and a width L. The wire grids adjacent each other are spaced apart from each other by a space S. Thus, the wire grid pattern 120b may form the wire grids having the height H, the width L and a pitch P which is sum of the width L and the space S.

The pitch P is defined as sum of the width L and the space S. The height H, the width L and the space S of the wire grid may have an optimal range according to material of the wire grid pattern 120b. For example, the width L may be about 45 nm to about 65 nm, the space S may be about 45 nm to about 65 nm, and the height H may be about 80 nm to about 200 nm.

Size of the wire grid pattern 120b may be controlled by adjusting thickness of the first layer 120 and the first block 135a and the second block 135b of the block copolymer 135 in FIG. 3.

The metal pattern 130b may be further disposed on the wire grid pattern 120b. Thickness of the metal pattern 130b may be about 10 to 20 nm.

Figure 4:
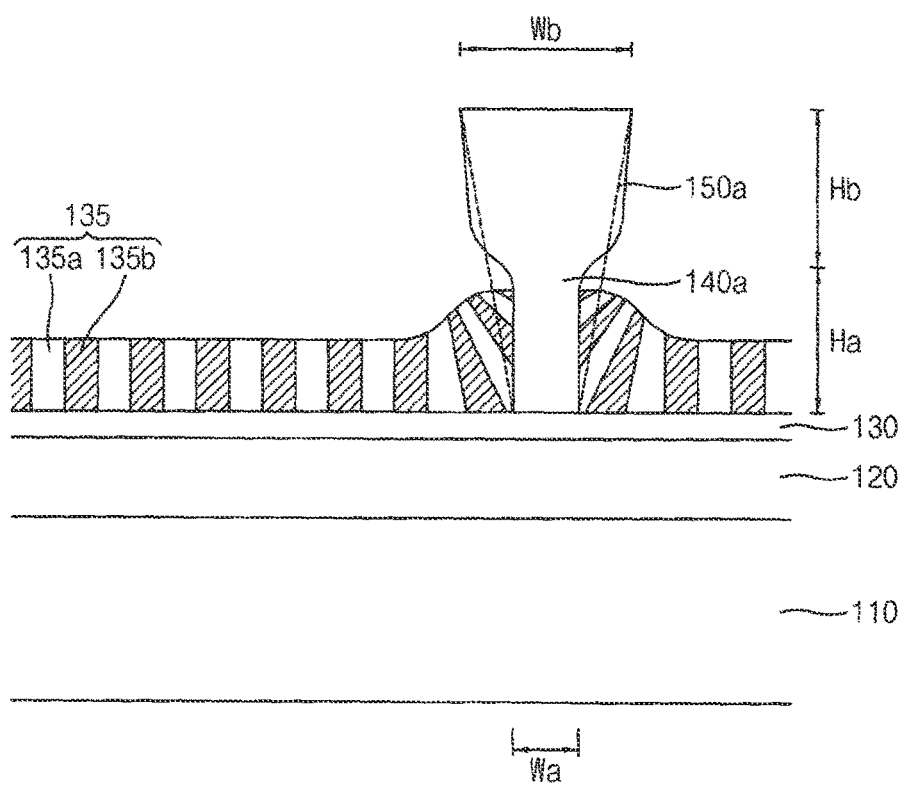
FIG. 4 is a partial enlarged view illustrating a method of manufacturing a polarizer according to an exemplary embodiment.

FIG. 4 is a partial enlarged view illustrating a method of manufacturing a polarizer according to an exemplary embodiment.

Referring to FIGS. 2I through 2M and 4, a second partition wall pattern 150a and a first partition wall pattern 140a may be formed by patterning the second partition wall layer 150 and the first partition wall layer 140 using the fourth layer pattern 170a and the third layer pattern 160a as a mask.

The first partition wall pattern 140a may include material having relatively high dry etch selectivity in comparison with the second partition wall pattern 150a, so that width of the second partition wall pattern 150a may be larger than that of the first partition wall pattern 140a. Thus, a cross-section of the first and second partition wall patterns 140a and 150a may have a trapezoid having an upper side longer than a lower side. In addition, the cross-section may have a shape that has upper side longer than a lower side, and has a curved side.

For example, the first partition wall patterns 140a may include a material having relatively high dry etch selectivity in comparison with the second partition wall pattern 150a, and the first and second partition walls 140 and 150 may be dry etched using fluoride gas.

For example, the cross-section is the trapezoid (dotted line in the figure), an upper side Wb of the second partition wall patter 150a may be about 1.25 um to about 2.5 um, a lower side of the first partition wall pattern 140a may be about 0.5 um to about 1 um, a first height Ha of the first partition wall pattern 140a may be about 0.5 um to bout 1 um, and a second height Hb of the second partition wall patter 150a may be about 0.5 um to about 1 um.

In addition, the cross-section may have a shape having a curved side. (full line in the figure) Here, the upper side Wb of the second partition wall patter 150a may be about 1.25 um to about 2.5 um, the lower side of the first partition wall pattern 140a may be about 0.5 um to about 1 um, the first height Ha of the first partition wall pattern 140a may be about 0.5 um to bout 1 um, and the second height Hb of the second partition wall patter 150a may be about 0.5 um to about 1 um.

Although not shown in the figure, a neutral layer may be formed on the second layer 130 and between the first and second partition wall patterns 140a and 150a, before the block copolymer layer 135 is formed.

The neutral layer may be identical to aforementioned embodiment, and their detailed descriptions are not repeated to avoid redundancy.

Referring to FIGS. 2M and 4, a block copolymer layer 135 may be formed on the second layer 130 between the first and second partition wall patterns 140a and 150a.

The block copolymer layer 135 may be the identical to aforementioned embodiment, and their detailed descriptions are not repeated to avoid redundancy.

Figure 5:
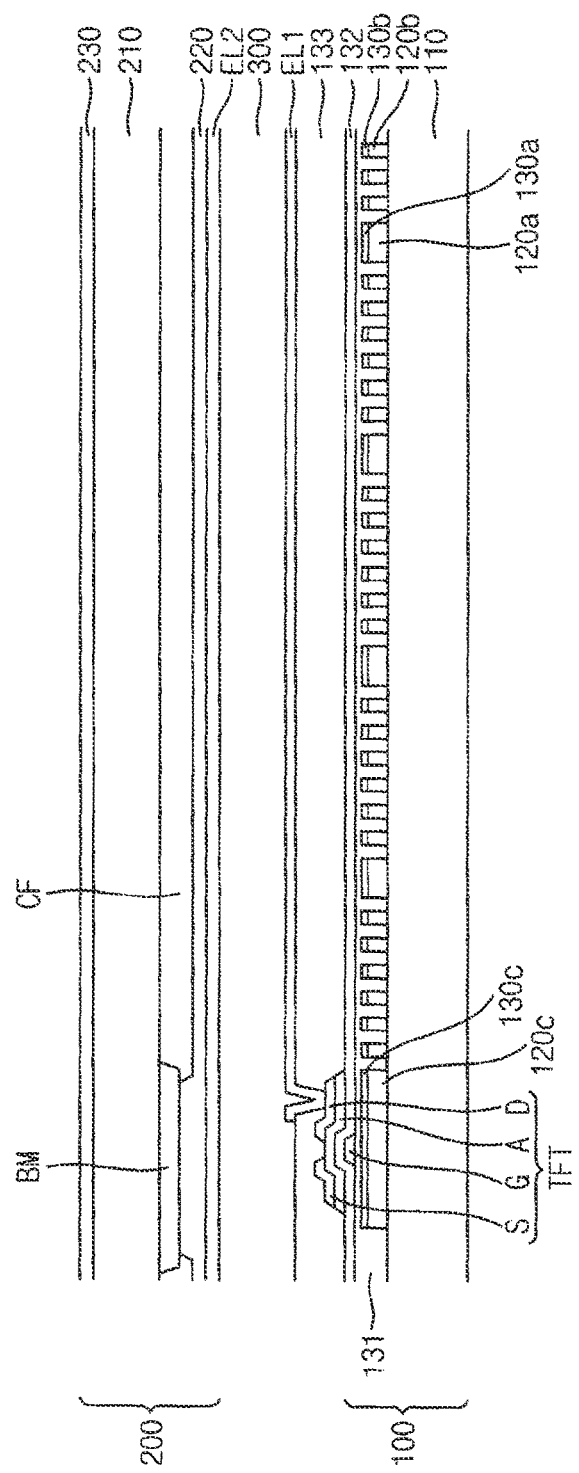
FIG. 5 is a cross-sectional view illustrating a display panel according to an exemplary embodiment.

FIG. 5 is a cross-sectional view illustrating a display panel according to an exemplary embodiment.

Referring to FIG. 5, the display panel may include a first substrate 100, a second substrate 200 and a liquid crystal layer 300.

The first substrate 100 may include a first base substrate 110, a first polarizer, a first insulation layer 131, a gate pattern, a second insulation layer 132, an active pattern A, a data pattern, a third insulation layer 133 and a first electrode EL1.

The first base substrate 110 may comprise a material which has relatively high transmittance, thermal resistance, and chemical resistance. For example the first base substrate 110 may comprise any one selected from the group consisting of glass, polyethylenenaphthalate, Polyethylene terephthalate, polyacryl and a mixture thereof.

The first polarizer may be disposed on the first base substrate 110. The first polarizer may be formed at a polarizing area and a peripheral area. Light for displaying an image may pass through the polarizing area. The peripheral area may be disposed adjacent to the polarizing area, and the light may be blocked by the peripheral area.

The first polarizer may include a plurality of partition wall pattern 120a and a wire grid pattern 120b in the polarizing area and a plate pattern 120c in the peripheral area.

The partition wall pattern 120a may be disposed on the first base substrate 110. A plurality of the partition wall patterns 120a may be disposed spaced apart each other by a predetermined distance on a cross-section of the polarizer. The partition wall pattern 120a may have a height H and a first width W1. The partition wall pattern 120a may extend in a direction which is substantially same as an extending direction of the wire grids of the wire grid pattern 120b. The first polarizer may be the same as the polarizer illustrated in FIG. 1.

For example, the height H of the partition wall pattern 120a may be about 80 nm (nanometer) to about 200 nm. The first width W1 of the partition wall pattern 120a may be about 1.25 um (micrometer) to about 2.5 um.

The partition wall pattern 120a may comprise any one selected from the group consisting of aluminum (Al), gold (Au), silver (Ag), copper (Cu), chrome (Cr), iron (Fe), nickel (Ni), molybdenum (Mo) and tungsten (W).

For example, two partition wall pattern 120a which are disposed adjacent each other may be spaced apart from each other by about 2 um to about 4 um. Thus, a distance D between the two partition wall patterns 120a may be about 2 um to about 4 um.

The metal pattern 130a may be disposed on the partition wall pattern 120a. The metal pattern 130a may comprise molybdenum (Mo) or titanium (Ti).

The wire grid pattern 120b may be disposed on the first base substrate 110 and between the partition wall patterns 120a. The wire grid pattern 120b forms a plurality of wire grids which extends in a direction. The wire grid has a height H and a width L. The wire grids adjacent each other are spaced apart from each other by a space S. Thus, the wire grid pattern 120*b* may form the wire grids having the height H, the width L and a pitch P which is sum of the width L and the space S.

The wire grid pattern 120*b* may comprise any one selected from the group consisting of aluminum (Al), gold (Au), silver (Ag), copper (Cu), chrome (Cr), iron (Fe), nickel (Ni), molybdenum (Mo) and tungsten (W).

The pitch P is defined as sum of the width L and the space S. The height H, the width L and the space S of the wire grid may have an optimal range according to material of the wire grid pattern 120*b*. For example, the width L may be about 45 nm to about 65 nm, the space S may be about 45 nm to about 65 nm, and the height H may be about 80 nm to about 200 nm.

The metal pattern 130*b* may be disposed on the wire grid pattern 120*b*. The metal pattern 130*b* may comprise molybdenum (Mo) or titanium (Ti).

The plate pattern 120*c* may be disposed on the base substrate 110. The plate pattern 120*c* may overlap a thin film transistor TFT, so that plate pattern 120*c* may block light to the thin film transistor TFT.

The plate pattern 120*c* may comprise any one selected from the group consisting of aluminum (Al), gold (Au), silver (Ag), copper (Cu), chrome (Cr), iron (Fe), nickel (Ni), molybdenum (Mo) and tungsten (W).

The metal pattern 130*c* may be further disposed on the plate pattern 120*c*. The metal pattern 130*c* may comprise molybdenum (Mo) or titanium (Ti).

The first insulation layer 131 may be disposed on the base substrate 110 on which the partition wall pattern 120*a*, the wire grid pattern 120*a*, the plate pattern 120*c* and the metal pattern 130*a*, 130*b* and 130*c*. The first insulation layer 131 may comprise silicon oxide SiOx.

The gate pattern may be disposed on the first insulation layer 131. The gate pattern may include a gate electrode G. The gate electrode G may overlap the plate pattern 120*c*.

The second insulation layer 132 may be disposed on the first insulation layer 131 on which the gate electrode G is disposed. The second insulation layer 132 may comprise an inorganic material such as silicon nitride SiNx or silicon oxide SiOx.

The active pattern A may be disposed on the second insulation layer 132. The active pattern A may comprise a semiconductor layer consisting of amorphous silicon (a-Si: H) and an ohmic contact layer consisting of n+ amorphous silicon (n+ a-Si:H). In addition, the active pattern A may include an oxide semiconductor. The oxide semiconductor may comprise an amorphous oxide including at least one selected from the group consisting of indium (In), zinc (Zn), gallium (Ga), tin (Sn) and hafnium (Hf). More particularly, the oxide semiconductor may comprise an amorphous oxide including indium (In), zinc (Zn) and gallium (Ga), or an amorphous oxide including indium (In), zinc (Zn) and hafnium (Hf). The oxide semiconductor may comprise an oxide such as indium zinc oxide (InZnO), indium gallium oxide (InGaO), indium tin oxide (InSnO), zinc tin oxide (ZnSnO), gallium tin oxide (GaSnO) and gallium zinc oxide (GaZnO).

The active pattern A may include a source area, channel area and a drain area. The channel area may overlap the gate electrode G. The source area may be connected to the channel area. The drain area may be connected to the channel area.

The data pattern may be disposed on the active pattern A. The data pattern may include a source electrode S and a drain electrode D. The source electrode S may be electrically connected to the source area of the active pattern A. The drain electrode D may be electrically connected to the drain area of the active pattern A.

The gate electrode G, the source electrode S, the drain electrode D and the active pattern A may form the thin film transistor TFT.

The third insulation layer 133 may be disposed on the second insulation layer 132 on which the thin film transistor TFT is disposed. The third insulation layer 133 may comprise inorganic material such as silicon oxide (SiOx) and/or silicon nitride (SiNx). In addition, the third insulation layer 133 may include organic insulating material having relatively low permittivity. In addition, the third insulation layer 133 may have a double layer structure of inorganic and organic insulating layers. The third insulation layer 133 has the contact hole exposing a portion of the drain electrode D.

The first electrode EL1 may be disposed on the third insulation layer 133. The first electrode EL1 may be electrically connected to the drain electrode D through the contact hole. The first electrode EL1 may have a slit pattern having a plurality of openings. The first electrode EL1 may comprise a transparent conductive material, such as indium tin oxide (ITO), indium zinc oxide (IZO) and etc.

The second substrate 200 may include a second base substrate 210, a black matrix BM, a color filter CF, an over coating layer 220, a second electrode EL2 and a second polarizer 230.

The second base substrate 210 may face the first substrate 100. The second substrate 210 may include a material which has relatively high transmittance, thermal resistance, and chemical resistance. For example the second substrate 210 may comprise any one selected from the group consisting of glass, polyethylenenaphthalate, Polyethylene terephthalate, polyacryl and a mixture thereof.

The black matrix BM may be disposed on the second substrate 210. The black matrix BM may be disposed adjacent to a display area where an image is displayed, and corresponds to a non-display area where the image is not displayed to block light. Thus, the black matrix BM may overlap the data pattern, the gate pattern and the thin film transistor TFT.

The color filter CF may be disposed on the second substrate 210 on which the black matrix BM is disposed. The color filter CF may supply colors to the light passing through the liquid crystal layer 300. The color filter CF may include a red color filter, a green color filter and blue color filter. The color filter CF corresponds to each of the display area of pixels. The color filters adjacent to each other may have different colors. The color filter CF may be overlapped with adjacent color filter CF near a boundary of the adjacent pixels, or the color filter CF may be spaced apart from adjacent color filter CF near the boundary.

The over coating layer 220 may be disposed color filter CF and the black matrix BM. The over coating layer 220 may planarize, protect and insulate the color filter CF. The over coating layer 220 may include acrylic epoxy.

The second electrode EL2 may be disposed corresponding to the display area of the pixel, and on the over coating layer 220. Thus, the second electrode EL2 may be disposed between the over coating layer 220 and the liquid crystal layer 300. A common voltage may be applied to the second electrode EL2. The second electrode EL2 may have a slit pattern having a plurality of openings. The second electrode EL2 may comprise a transparent conductive material, such as indium tin oxide (ITO), indium zinc oxide (IZO) and etc.

The second polarizer 230 may be disposed on the second base substrate 210. Thus, the second polarizer 230 may be disposed on opposite side of the liquid crystal layer 300 with respect to the second base substrate 210. A polarizing axis of the second polarizer 230 may be substantially perpendicular to a polarizing axis of the first polarizer. The second polarizer 230 may be a traditional absorption type polarizer. In addition, the second polarizer 230 may be a wire grid polarizer like the first polarizer.

The liquid crystal layer 300 may be disposed between the first substrate 100 and the second substrate 200. The liquid crystal layer 300 may comprise liquid crystal molecules having optical anisotropy. The liquid crystal molecules may be driven by electric field, so that an image may be displayed by passing or blocking light through the liquid crystal layer 300.

Figure 6:
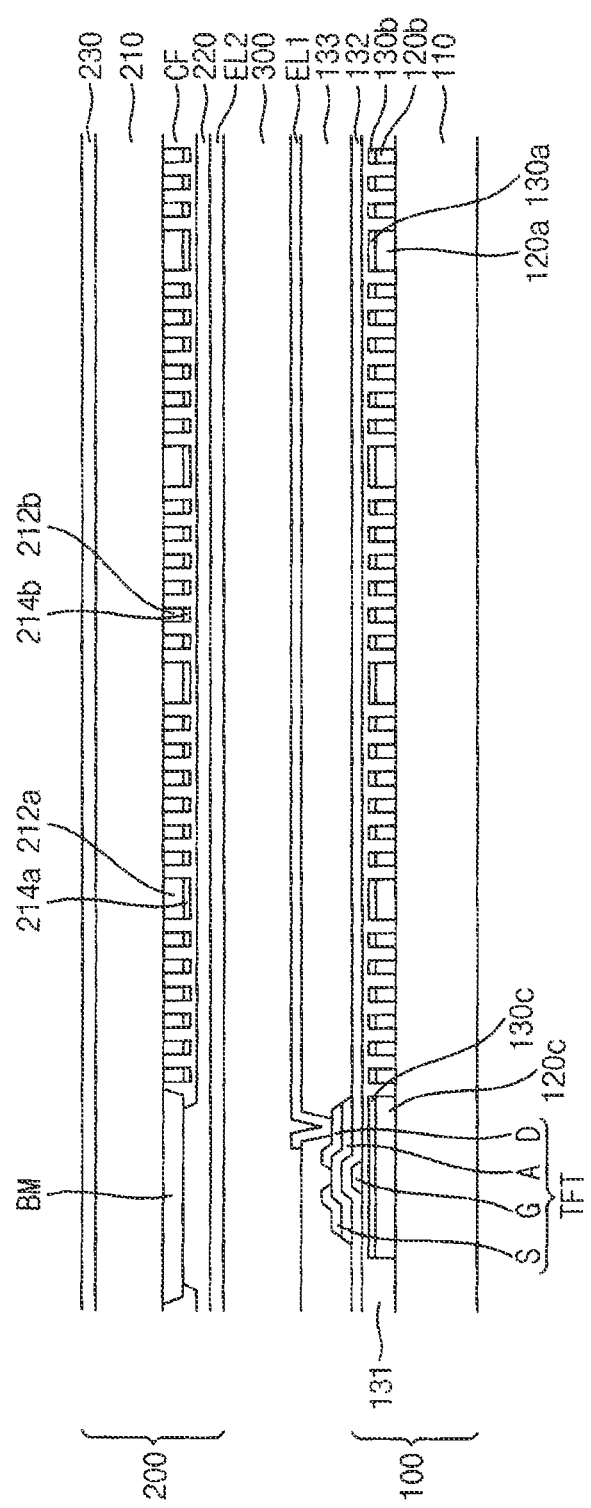
FIG. 6 is a cross-sectional view illustrating a display panel according to another exemplary embodiment.

FIG. 6 is a cross-sectional view illustrating a display panel according to another example embodiment.

Referring to FIG. 6, the display panel may include a first substrate 100, a second substrate 200 and a liquid crystal layer 300.

The first substrate 100 may include a first base substrate 110, a first polarizer, a first insulation layer 131, a gate pattern, a second insulation layer 132, an active pattern A, a data pattern, a third insulation layer 133 and a first electrode EL1.

The first substrate 100 may be substantially same as said first substrate of the FIG. 5. Thus, any further detailed descriptions concerning the same elements will be omitted.

The second substrate 200 may include a second substrate 210, a second polarizer, a black matrix BM, a color filter CF, an over coating layer 220 and a second electrode EL2.

The second base substrate 210 may face the first substrate 100. The second substrate 210 may comprise a material which has relatively high transmittance, thermal resistance, and chemical resistance. For example the second substrate 210 may comprise any one selected from the group consisting of glass, polyethylenenaphthalate, Polyethylene terephthalate, polyacryl and a mixture thereof.

The second polarizer may be disposed on the second base substrate 210. A polarizing axis of the second polarizer may be substantially perpendicular to a polarizing axis of the first polarizer.

The second polarizer may include a plurality of partition wall pattern 212a and a wire grid pattern 212b in a polarizing area.

The partition wall pattern 212a may be disposed on the second base substrate 210. A plurality of the partition wall patterns 212a may be disposed spaced apart each other by a predetermined distance on a cross-section of the polarizer. The partition wall pattern 212a may have a height H and a first width W1. The partition wall pattern 212a may extend in a direction which is substantially same as an extending direction of the wire grids of the wire grid pattern 212b. The second polarizer may be the same as the polarizer illustrated in FIG. 1.

For example, the height H of the partition wall pattern 212a may be about 80 nm (nanometer) to about 200 nm. The first width W1 of the partition wall pattern 212a may be about 1.25 um (micrometer) to about 2.5 um.

The partition wall pattern 212a may comprise any one selected from the group consisting of aluminum (Al), gold (Au), silver (Ag), copper (Cu), chrome (Cr), iron (Fe), nickel (Ni), molybdenum (Mo) and tungsten (W).

For example, two partition wall pattern 212a which are disposed adjacent each other may be spaced apart from each other by about 2 um to about 4 um. Thus, a distance D between the two partition wall patterns 212a may be about 2 um to about 4 um.

The metal pattern 214a may be disposed on the partition wall pattern 212a. The metal pattern 214a may comprise molybdenum (Mo) or titanium (Ti).

The wire grid pattern 212b may be disposed on the second base substrate 210 and between the partition wall patterns 212a. The wire grid pattern 212b forms a plurality of wire grids which extends in a direction. The wire grid has a height H and a width L. The wire grids adjacent each other are spaced apart from each other by a space S. Thus, wire grid pattern 212b may form the wire grids having the height H, the width L and a pitch P which is sum of the width L and the space S.

The wire grid pattern 212b may comprise any one selected from the group consisting of aluminum (Al), gold (Au), silver (Ag), copper (Cu), chrome (Cr), iron (Fe), nickel (Ni), molybdenum (Mo) and tungsten (W).

The pitch P is defined as sum of the width L and the space S. The height H, the width L and the space S of the wire grid may have an optimal range according to material of the wire grid pattern 212b. For example, the width L may be about 45 nm to about 65 nm, the space S may be about 45 nm to about 65 nm, and the height H may be about 80 nm to about 200 nm.

The metal pattern 214b may be disposed on the wire grid pattern 212b. The metal pattern 214b may comprise molybdenum (Mo) or titanium (Ti).

The black matrix BM may be disposed on the second base substrate 210. The black matrix BM may be disposed corresponding to a non-display area which is adjacent to a display area and blocks light. Thus, the black matrix BM may overlaps with a data line, a gate line and a thin film transistor TFT.

The color filter CF is disposed on second substrate 210 on which the second polarizer and the black matrix BM are disposed. The color filter CF may supply colors to the light passing through the liquid crystal layer 300. The color filter CF may include a red color filter, a green color filter and blue color filter. The color filter CF corresponds to each of the display area of pixels. The color filters adjacent to each other may have different colors. The color filter CF may be overlapped with adjacent color filter CF near a boundary of the adjacent pixels, or the color filter CF may be spaced apart from adjacent color filter CF near the boundary.

The over coating layer 220 may be disposed color filter CF and the black matrix BM. The over coating layer 220 may planarize, protect and insulate the color filter CF. The over coating layer 220 may include acrylic epoxy.

The second electrode EL2 may be disposed corresponding to the display area of the pixel, and on the over coating layer 220. Thus, the second electrode EL2 may be disposed between the over coating layer 220 and the liquid crystal layer 300. A common voltage may be applied to the second electrode EL2. The second electrode EL2 may have a slit pattern having a plurality of openings. The second electrode EL2 may include a transparent conductive material, such as indium tin oxide (ITO), indium zinc oxide (IZO) and etc.

The liquid crystal layer 300 may be disposed between the first substrate 100 and the second substrate 200. The liquid crystal layer 300 may include liquid crystal molecules having optical anisotropy. The liquid crystal molecules may be driven by electric field, so that an image may be displayed by passing or blocking light through the liquid crystal layer 300.

According to the present example embodiment, a polarizer may include a plurality of partition wall patterns having a first width. A wire grid pattern may be uniformly disposed between the partition wall patterns.

According to the present example embodiment of a method of manufacturing a polarizer, a first width of the first partition wall pattern is smaller than a second width of the second partition wall pattern, and a first height of the first partition wall pattern may be more than two times higher than height of first and second blocks of the block copolymer layer. Accordingly, where uneven pattern formed adjacent to the first partition wall pattern due to agglomeration of the first and second blocks may be covered by the second partition wall pattern, so that uniform wire grid pattern may be formed between the second partition wall patterns.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A method of manufacturing a polarizer, comprising:
   forming a first layer on a base substrate;
   forming a first partition wall layer on the first layer;
   forming a second partition wall layer on the first partition wall layer;
   forming a plurality of first partition wall patterns and a plurality of second partition wall patterns disposed on the first partition wall patterns by etching the first partition wall layer and the second partition wall layer;
   forming a block copolymer layer on the first layer on which the plurality of first partition wall patterns are formed;
   forming a plurality of patterns from the block copolymer layer; and
   patterning the first layer using the pattern as a mask.

2. The method of claim 1, wherein the first partition wall layer comprises a material having relatively higher etch selectivity in comparison with the second partition wall layer.

3. The method of claim 2, wherein the first partition wall layer comprises silicon nitride, and the second partition wall layer comprises silicon oxide.

4. The method of claim 1, wherein the block copolymer layer comprises first polymer blocks and second polymer blocks which are in covalent bond with 1:1 volume ratio.

5. The method of claim 4, wherein the step of forming the plurality of patterns further comprises:
   forming the plurality of patterns having a plurality of first blocks and a plurality of second blocks which have monomer units,
   wherein the plurality of second blocks consist of monomer unit having components different from components of monomer unit of the plurality of first blocks, and
   wherein the plurality of first blocks and the plurality of second blocks are formed by rearrangement of components of the block copolymer layer through a phase separation.

6. The method of claim 1, wherein each of the plurality of second partition wall patterns is more than twice wider than each of the plurality of first partition wall patterns.

7. The method of claim 6, wherein each of the plurality of first partition wall patterns is about 0.5 to 1 um (micrometer) wide, and each of the plurality of second partition wall pattern is about 1.25 to 2.5 um wide.

8. The method of claim 1, further comprising:
   forming a second layer on the first layer before forming the plurality of first partition wall layers.

9. The method of claim 1, further comprising: forming a plurality of wire grid patterns corresponding to the plurality of patterns and a plurality of partition wall patterns corresponding to the plurality of second partition wall patterns by patterning the first layer.

10. The method of claim 9, wherein a width of each of the plurality of partition wall patterns is substantially same as that of each of the plurality of second partition wall patterns.

11. The method of claim 1, wherein a cross-section of each of the plurality of first partition wall patterns and each of the plurality of second partition wall patterns is trapezoid having an upper side longer than a lower side.

12. The method of claim 1, wherein a cross-section of each of the plurality of first partition wall patterns and each of the plurality of second partition wall patterns is a shape that has upper side longer than a lower side, and has a curved side.

13. The method of claim 1, wherein forming the plurality of first partition wall patterns and the plurality of second partition wall patterns further comprises:
   forming a third layer on the second partition wall layer;
   forming a fifth layer on the third layer;
   forming a photoresist pattern on the fifth layer;
   forming a fifth layer pattern by etching the fifth layer using the photoresist pattern as a mask;
   forming a sixth layer on the fifth layer pattern and the third layer;
   forming a sixth layer pattern by etching the sixth layer;
   removing the fifth layer pattern;
   forming a third layer pattern by etching the third layer using the sixth layer pattern as a mask; and
   forming the plurality of first partition wall patterns and the plurality of second partition wall patterns by etching the first partition wall and the second partition wall using the third layer pattern as a mask.

* * * * *